US007816997B2

(12) United States Patent
Forstner et al.

(10) Patent No.: US 7,816,997 B2
(45) Date of Patent: Oct. 19, 2010

(54) ANTENNA MULTIPLEXER WITH A PI-NETWORK CIRCUIT AND USE OF A PI-NETWORK

(75) Inventors: Hans-Peter Forstner, Steinhoering (DE); Bernhard Gebauer, Beyharting (DE); Ngoc-Hoa Huynh, Forstinning (DE)

(73) Assignee: Infineon Technologies AG, Neubiberg (DE)

( * ) Notice: Subject to any disclaimer, the term of this patent is extended or adjusted under 35 U.S.C. 154(b) by 23 days.

(21) Appl. No.: 11/862,050

(22) Filed: Sep. 26, 2007

(65) Prior Publication Data

US 2008/0079648 A1 Apr. 3, 2008

Related U.S. Application Data

(60) Provisional application No. 60/848,135, filed on Sep. 29, 2006.

(30) Foreign Application Priority Data

Sep. 29, 2006 (DE) ....................... 10 2006 046 185

(51) Int. Cl.
*H03H 7/38* (2006.01)

(52) U.S. Cl. ........................ 333/126; 333/129; 333/132

(58) Field of Classification Search ................. 333/124, 333/126, 129, 132, 17.3, 32, 263

See application file for complete search history.

(56) References Cited

U.S. PATENT DOCUMENTS

| | | | | |
|---|---|---|---|---|
| 4,281,293 | A * | 7/1981 | Childs et al. | 329/305 |
| 6,331,930 | B1 * | 12/2001 | Kuroda et al. | 361/306.3 |
| 6,525,624 | B1 * | 2/2003 | Hikita et al. | 333/133 |
| 7,135,943 | B2 * | 11/2006 | Lin et al. | 333/132 |
| 7,339,445 | B2 * | 3/2008 | Aigner et al. | 333/133 |
| 7,403,082 | B2 * | 7/2008 | Kearns | 333/126 |
| 7,498,899 | B2 * | 3/2009 | Iwaki et al. | 333/133 |

* cited by examiner

*Primary Examiner*—Robert Pascal
*Assistant Examiner*—Kimberly E Glenn
(74) *Attorney, Agent, or Firm*—Slater & Matsil, L.L.P.

(57) ABSTRACT

An antenna multiplexer with a pi-network circuit is described, having an inductance connected in series and, on each of the two connection sides of the inductance, a capacitance connected in parallel. The pi-network circuit is used for effecting an impedance mismatch of a signal path of the antenna multiplexer.

11 Claims, 1 Drawing Sheet

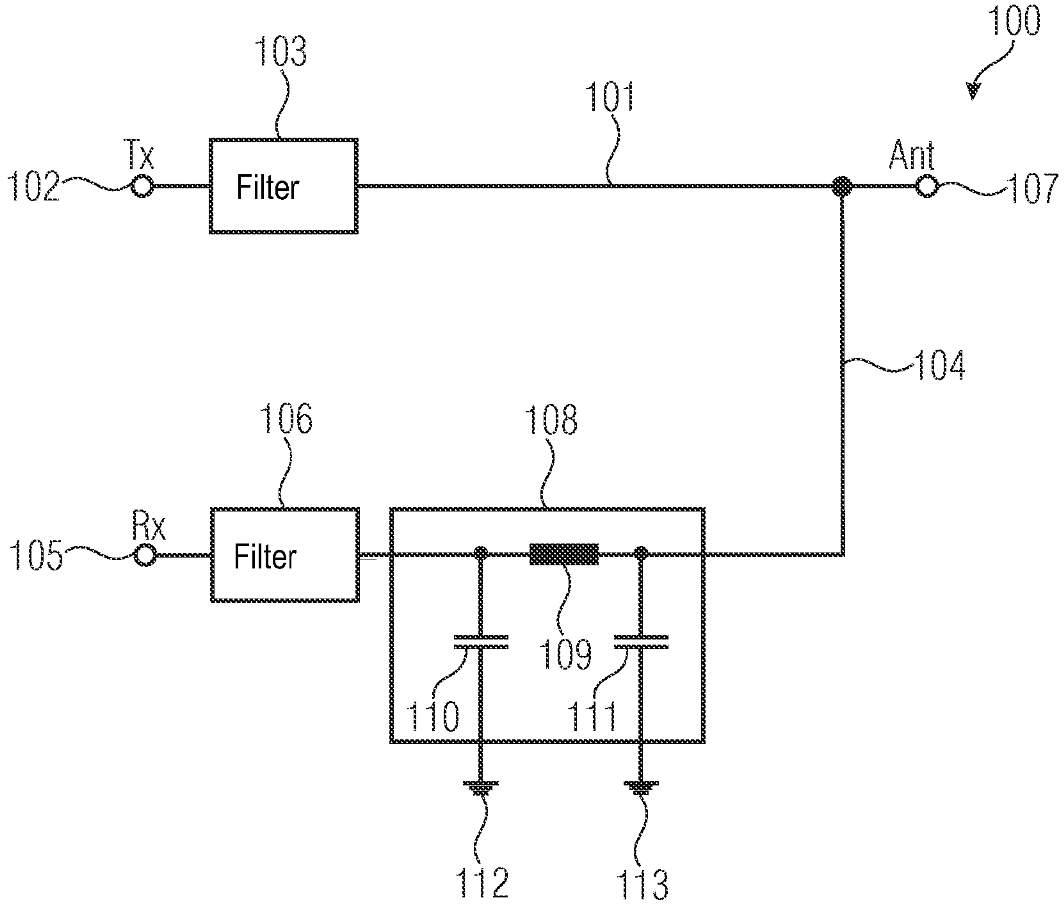
100
103
101
Tx
Ant
102
Filter
107
104
106
108
Rx
105
Filter
109
110
111
112
113

ANTENNA MULTIPLEXER WITH A PI-NETWORK CIRCUIT AND USE OF A PI-NETWORK

This application claims priority to German Patent Application 10 2006 046 185.1, which was filed Sep. 29, 2006 and to U.S. Provisional Application Ser. No. 60/848,135, which was filed on Sep. 29, 2006, both of which are incorporated herein in their entirety by reference.

TECHNICAL FIELD

Embodiments of the invention are related to an antenna multiplexer with a pi-network circuit and a use of a pi-network circuit.

BACKGROUND

In an antenna multiplexer with several signal paths it is desirable that a signal passing through one of the signal paths interferes as little as possible with another signal path and/or the signal allocated thereto.

SUMMARY OF THE INVENTION

According to an embodiment of the invention, an antenna multiplexer with a pi-network circuit is provided. The pi-network circuit comprises an inductance coupled in series and, on each of the two connection sides of the inductance, a capacitance coupled in parallel.

According to another embodiment of the invention, a pi-network circuit includes an inductance coupled in series and, on each of the two connection sides of the inductance, a capacitance coupled in parallel is used for effecting an impedance mismatch of a signal path of an antenna multiplexer.

BRIEF DESCRIPTION OF THE DRAWINGS

Embodiments of the present invention will be detailed subsequently referring to the appended drawing, in which:

The lone FIGURE provides a block diagram of an antenna multiplexer according to an embodiment of the invention.

DETAILED DESCRIPTION OF ILLUSTRATIVE EMBODIMENTS

Embodiments described in the following in connection with the antenna multiplexer, analogously also apply to the use of a pi-network circuit and vice versa.

An antenna multiplexer may comprise several signal paths. It serves to connect a transmit or receive unit or a combined transmit/receive unit to several antennas or to connect one antenna to several transmit and/or receive units. The signals allocated to the various signal paths may be present in a time-shifted or simultaneous manner, that is, they may be received and/or transmitted in a time-shifted or simultaneous manner. A multiplexer having two signal paths is also referred to as a duplexer, a multiplexer having three signal paths is also referred to as a triplexer. If an antenna multiplexer connects a transmit and a receive unit to an antenna, for example, this is also referred to as a transmit/receive antenna duplexer.

An antenna multiplexer in a mobile radio telephone of a CDMA and a WCDMA system (such as UMTS or PCS) has the function, for example, of filtering the ingoing signal (from the antenna) and the signal to be emitted (from the power amplifier) and therefore is a transmit/receive duplexer. In this duplex operation, the input signal and the output signal pass the duplexer simultaneously. In contrast to the TDMA system (for example, GSM), where the two signals are received and transmitted in a time-shifted manner, in CDM and/or WCDMA systems, no switch may be used for switching between the signal paths. High isolation and stop band suppression pose substantial challenges in simultaneous duplex operation. The transmit signal path (Tx) may comprise a transmit signal filter (Tx filter) and the receive signal path (Rx) may comprise a receive signal filter (Rx filter). For isolating the two Tx and Rx filters from each other, a phase shifter may be provided. Its task is transforming the low-impedance Rx input impedance in the Tx passband frequency range to a high-impedance one so as to ensure good isolation. At the same time, it advantageously avoids deteriorating the input impedance of the Rx filter in the Rx reception frequency range.

According to an embodiment of the invention, a pi-network circuit comprising an inductance connected in series and, on each of the two connection sides of the inductance, a capacitance connected in parallel is used as a phase shifter. Such an arrangement of devices is referred to as a pi-network circuit, a pi network or a pi filter as its general graphic representation in a circuit diagram resembles the shape of the Greek letter "pi". The pi-network circuit used as a phase shifter enables transformation of the low-impedance Rx input impedance to a high-impedance one in the Tx passband frequency range as well as furthermore good matching to the input impedance of the Rx filter in the Rx passband frequency range. The devices used for the pi-network circuit may be realized as distributed structural components in compact form on a laminate used as a carrier substrate. A phase shifter embodied as a pi-network circuit may be realized on a thin carrier substrate such as a four-ply laminate having metallization planes spaced apart in the range from 70 to 60 micrometers or less.

According to an embodiment of the invention, the antenna multiplexer comprises an antenna connection and a plurality of signal connections, wherein the pi-network circuit is arranged in a signal path between the antenna connection and one of the signal connections.

According to an embodiment of the invention, the pi-network circuit is configured to effect an impedance mismatch of the signal path for signals present on the antenna connection side.

According to an embodiment of the invention, the pi-network circuit is configured to transform a low-impedance input impedance of the signal path to a high-impedance input impedance by means of a phase shift by 180 degrees.

According to various embodiments of the invention, the signal path is a receive signal path.

According to various embodiments of the invention, the signal path is a receive signal path and the antenna multiplexer further comprises a transmit signal path, wherein the pi-network circuit is configured to transform a low-impedance input impedance of the receive signal path to a high-impedance input impedance in a transmit frequency range of the transmit signal path.

According to various embodiments of the invention, the signal path is a transmit signal path.

According to various embodiments of the invention, the signal path is a first transmit signal path and the antenna multiplexer further comprises a second transmit signal path, wherein the pi-network circuit is configured to transform a low-impedance input impedance of the first transmit signal path in a transmit frequency range of the second transmit signal path to a high-impedance input impedance.

According to an embodiment of the invention, the antenna multiplexer is a mobile-radio-telephone antenna multiplexer.

According to various embodiments of the invention, the mobile-radio-telephone antenna multiplexer is a CDMA or WCDMA mobile-radio-telephone antenna multiplexer.

According to various embodiments of the invention, the inductance of the pi-network circuit is configured as a high-impedance microstrip line of a multi-ply laminate.

According to various embodiments of the invention, the inductance of the pi-network circuit is configured as an SMD device (surface mounted device).

According to various embodiments of the invention, at least one capacitance of the pi-network circuit is configured as a plate capacitor, the plates of which are arranged in two adjacent metallization planes of a multi-ply laminate.

According to various embodiments of the invention, the inductance of the pi-network circuit has a value between about 0.2 and about 100 nH. A pi-network circuit having this value may be used in an antenna multiplexer for mobile radio telephones.

According to various embodiments of the invention, the inductance of the pi-network circuit may have a value between about 1 and about 20 nH. A pi-network circuit having this value is particularly appropriate for being used for isolating a receive signal path from a transmit signal path.

According to various embodiments of the invention, the two capacitances of the pi-network circuit each have values between about 0.05 and about 30 pF. A pi-network circuit having these values may be used in an antenna multiplexer for mobile radio telephones.

According to various embodiments of the invention, the two capacitances of the pi-network circuit each have values between about 0.3 and about 6 pF. A pi-network circuit having these values is particularly appropriate for being used for isolating a receive signal path from a transmit signal path.

According to an embodiment of the invention, a pi-network circuit is used for effecting an impedance mismatch of a signal path of an antenna multiplexer, the signal path having a low-impedance input impedance on the side of the antenna connection and the pi-network circuit transforming the low-impedance input impedance to a high impedance input impedance.

According to an embodiment of the invention, the antenna multiplexer further comprises a transmit signal path, and the pi-network circuit functions as a phase shifter isolating the signal path from the transmit signal path in a transmit frequency range of the transmit signal path.

Referring to FIG. 1, in the following a block diagram of an antenna multiplexer according to an embodiment of the invention is described in greater detail.

The block diagram shows a transmit/receive antenna duplexer as it is necessitated, for example, in a mobile radio telephone for the PCS mobile radio system. The duplexer 100 has a transmit signal path 101 with a transmit signal input 102 and a transmit signal filter 103. It further has a receive signal path 104 with a receive signal output 105 and a receive signal filter 106. Both the transmit signal path 101 and the receive signal path 104 are connected to the common antenna connection 107.

The receive signal path 104 further comprises a phase shifter 108. The phase shifter 108 is embodied as a pi-network circuit. Within the circuit block known as the phase shifter 108, a circuit diagram of the pi-network circuit is schematically represented. An inductance 109 connected in series to the receive signal path 104 is shown. Furthermore, capacitances 110 and 111 connected in parallel to the receive signal path are located on each of the two connection sides of the inductance. For the clarification of the parallel connection, the two ground connections 112 and 113 are drawn in, which are connected to the connections of the capacitances 110 and 111 facing away from the receive signal path.

By means of the phase shifter 108 embodied as a pi-network circuit, the low-impedance input impedance of the receive signal filter 106 is transformed to a high-impedance input impedance in the transmit frequency range, that is in the pass range of the transmit signal filter 103. This serves to isolate the receive signal filter 106 and the transmit signal filter 103 from each other, that is, the receive signal path 104 and the transmit signal path 101 are isolated from each other. Furthermore, the pi-network circuit is dimensioned such that in the reception frequency range, there is sufficiently good impedance matching of the receive signal filter 106 to the antenna impedance.

In one embodiment, the devices of the pi-network circuit are realized as distributed structural components on a four-ply laminate as a carrier substrate in a very compact manner. The inductance 109 is a coil that is realized by a high-impedance microstrip line. The signal line is located in the four-ply laminate in the first metallization plane, and the ground in the third metallization plane. The two capacitances 110 and 111 connected in parallel are housed in the third and fourth metallization planes in the form of plate capacitors.

The transmit signal filter 103 and the receive signal filter 106 are realized as bulk-acoustic-wave filters (BAW). Favorable transmission characteristics of the antenna duplexer are yielded when the inductance 109 has a value of about 3.6 to about 5.2 nH and the two capacitances 110 and 112 each have a value of about 1 to about 2 pF. Patterns are fabricated using a four-ply laminate having metallization planes spaced apart by 70, 60 and 70 micrometers.

According to another embodiment of the invention, there is provided an antenna multiplexer with a pi-network circuit comprising an inductance connected in series and, on each of the two connection sides of the inductance, a capacitance connected in parallel, and with an antenna connection and a receive signal output coupled to the antenna connection, wherein the pi-network circuit is arranged in the signal path between the antenna connection and the receive signal output.

According to this and other embodiments of the invention, the antenna multiplexer comprises a receive signal filter, which is arranged in the signal path between the pi-network circuit and the receive signal output.

According to this and other embodiments of the invention, the antenna multiplexer comprises a transmit signal input coupled to the antenna connection, wherein the signal path between the transmit signal input and the antenna connection is commoned, on the side of the antenna connection up to a branch, with the signal path between the antenna connection and the receive signal output, and wherein the pi-network circuit is arranged in the signal path between the branch and the receive signal output.

According to this and other embodiments of the invention, the antenna multiplexer comprises a transmit signal filter arranged in the signal path between the transmit signal input and the branch.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

What is claimed is:

1. An antenna multiplexer comprising: a pi-network circuit comprising an inductance and, on each of two connection sides of the inductance, a corresponding capacitance coupled in parallel; an antenna connection and a plurality of signal connections concurrently coupled to the antenna connection without a switch there between, wherein the pi-network circuit is arranged in a signal path between the antenna connection and one of the signal connections only; wherein the pi-network circuit is adapted to effect an impedance mismatch of the signal path for signals present at a side of the antenna connection; and wherein the pi-network circuit is adapted to transform a low-impedance input impedance of the signal path to a high-impedance input impedance by a phase shift by 180 degrees.

2. The antenna multiplexer of claim 1, wherein the signal path is a receive signal path, the antenna multiplexer further comprising a transmit signal path coupled to the pi-network circuit.

3. The antenna multiplexer of claim 1, wherein the signal path is a first transmit signal path, the antenna multiplexer further comprising a second transmit signal path coupled to the pi-network circuit.

4. The antenna multiplexer of claim 1, wherein the antenna multiplexer is a mobile-radio-telephone antenna multiplexer.

5. The antenna multiplexer of claim 4, wherein the mobile-radio-telephone antenna multiplexer is a CDMA or WCDMA mobile-radio-telephone antenna multiplexer.

6. The antenna multiplexer of claim 1, wherein at least one of the corresponding capacitance of the pi-network circuit is formed as a plate capacitor, and plates of the plate capacitor are arranged in two adjacent metallization planes of a multiply laminate.

7. The antenna multiplexer of claim 1, wherein the inductance of the pi-network circuit comprises a value between 0.2 and 100 nH.

8. The antenna multiplexer of claim 7, wherein the inductance of the pi-network circuit comprises a value between 1 and 20 nH.

9. The antenna multiplexer of claim 1, wherein the corresponding capacitances of the pi-network circuit each comprise values between 0.05 and 30 pF.

10. The antenna multiplexer of claim 9, wherein the corresponding capacitances of the pi-network circuit each comprise values between 0.3 and 6 pF.

11. An antenna multiplexer comprising: a pi-network circuit comprising an inductance and, on each of two connection sides of the inductance, a corresponding capacitance coupled in parallel; an antenna connection and a plurality of signal connections concurrently coupled to the antenna connection without a switch there between, wherein the pi-network circuit is arranged in a first transmit signal path between the antenna connection and one of the signal connections only; and a second transmit signal path, wherein the pi-network circuit is adapted to transform a low-impedance input impedance of the first transmit signal path to a high-impedance input impedance in a transmit frequency range of the second transmit signal path.

* * * * *